United States Patent
Kang

(10) Patent No.: US 6,711,079 B2
(45) Date of Patent: Mar. 23, 2004

(54) DATA BUS SENSE AMPLIFIER CIRCUIT

(75) Inventor: Won Jun Kang, Seoul (KR)

(73) Assignee: Hynix Semiconductor Inc., Ichon-shi (KR)

( * ) Notice: Subject to any disclaimer, the term of this patent is extended or adjusted under 35 U.S.C. 154(b) by 224 days.

(21) Appl. No.: 09/978,789

(22) Filed: Oct. 18, 2001

(65) Prior Publication Data

US 2002/0048207 A1 Apr. 25, 2002

(30) Foreign Application Priority Data

Oct. 20, 2000 (KR) .......................................... 2000-61799

(51) Int. Cl.⁷ ................................................. G11C 7/00
(52) U.S. Cl. ...................................... 365/207; 365/208
(58) Field of Search ................................ 365/205, 207, 365/208, 203

(56) References Cited

U.S. PATENT DOCUMENTS

| | | | | |
|---|---|---|---|---|
| 4,694,205 A | * | 9/1987 | Shu et al. | 327/53 |
| 5,831,897 A | * | 11/1998 | Hodges | 365/156 |
| 5,949,706 A | * | 9/1999 | Chang et al. | 365/156 |

* cited by examiner

Primary Examiner—Vu A. Le
(74) Attorney, Agent, or Firm—Pillsbury Winthrop LLP

(57) ABSTRACT

The inventions relate to a data bus sense amplifier circuit. A switching unit includes a PMOS transistor which serves as an input terminal for a sense amp enable signal for maintaining a power supply voltage precharge state of a data bus sense amp. This arrangement allows for reduced leakage current between the switching unit and a ground terminal, and a sensed width by self-asymmetry during a precharge period is decreased, to easily invert a wanted data in a read operation. In addition, the sense amp enable signal is a pulse type for facilitating a high speed sensing operation in a high pulse operation, thereby improving a speed.

4 Claims, 3 Drawing Sheets

DATA BUS SENSE AMPLIFIER CIRCUIT

BACKGROUND OF THE INVENTION

1. Field of the Invention

The present invention relates to a data bus sense amplifier circuit, and in particular to an improved data bus sense amplifier circuit for reducing noise generated during its read mode operation and increasing a read margin in a VLSI semiconductor DRAM device into which it is incorporated.

2. Description of the Background Art

FIG. 1 (Prior Art) is a circuit diagram of a conventional data bus sense amplifier circuit. The conventional data bus sense amplifier circuit comprises a precharge unit 10, an amplifying unit 20 and a switching unit 30.

The precharge unit 10 includes PMOS transistors P1 and P2 which switch according to a state of a sense amp enable signal RSASEL input in the form of a pulse signal to generate a precharge voltage. A PMOS transistor P3 equalizes output terminals of the precharge unit 10.

The amplifying unit 20 includes NMOS transistors N1 and N2 and PMOS transistors P4 and P5 connected in a cross-coupled structure. NMOS transistors N3 and N4 receive data signals through their respective gate terminals from data bus lines LIO and LIOb. Accordingly, a data bus sense amp switches NMOS transistors N6 and N7 by sensing the data from the data bus lines LIO and LIOb, thereby controlling bit line read signals BL_RD and BL_RDb.

The switching unit 30 includes an NMOS transistor N5. When the sense amp enable signal RSASEL is enabled, the switching unit 30 grounds a leakage current generated in the amplifying unit 20 to a ground terminal.

In this conventional data bus sense amplifier circuit, the sense amp must maintain an identical power supply voltage state in a precharge mode, and sense the data from the data bus lines LIO and LIOb rapidly when the sense amp enable signal RSASEL is enabled in a read mode.

The conventional data bus sense amplifier circuit has some operational disadvantages including the following:

First, the conventional data bus sense amp requires an extended period of time to completely enable a pulse of the sense amp enable signal to a high level due to noise generated by a peripheral power source line. Accordingly, the NMOS transistor N5 of the switching unit 30 is not rapidly turned on, thus reducing a sensing speed.

Second, the conventional data bus sense amp cannot maintain a complete low state of the sense amp enable signal RSASEL due to noise generated by a peripheral line before a read operation, especially the power supply line.

In this case, the sense amp enable signal RSASEL is unnecessarily enabled at a high level due to noise of a sense amp enable signal line, thereby generating the leakage current in the NMOS transistor N5 connected to an input line of the sense amp enable signal RSASEL.

That is, when data opposite to the existing data is inputted to the data bus lines LIO and LIOb in an actual read operation, the leakage current is generated from one of the NMOS transistors N3 and N4 of the amplifying unit 20 to the NMOS transistor N5, thereby causing data failure.

Moreover, in the case that all the lines are connected to a power supply voltage in a precharge period, the leakage current is continuously generated, which results in high power consumption.

SUMMARY OF THE INVENTION

Among the inventions described and claimed in this patent document, there is an object in providing a data bus sense amplifier circuit which rapidly turn on a switching unit when a sense amp enable signal is enabled thereby improving sensing speed than that of conventional data bus sense amplifiers.

There is also an object in providing a data bus sense amplifier circuit which can prevent the flow of a leakage current generated in a switching unit by connecting switching transistors in series to the switching unit for grounding a sensing current, when a sense amp enable signal is disabled.

These inventions are provided by utilizing novel circuit arrangements. In one respect, our data bus sense amplifier circuit includes an amplifying unit, a precharge unit and a switching means. An amplifying unit having a cross-coupled structure for sensing data of a data bus line according to a sense amp control signal. A precharge unit provides a precharge voltage to the amplifying unit according to a sense amp enable signal. A switching means has a transmission gate at an input terminal of the sense amp enable signal to ground a sensing voltage of the amplifying unit when the sense amp enable signal is enabled.

According to one aspect of the inventions, a data bus sense amplifier circuit includes an amplifying unit, a precharge unit and a switching means. An amplifying unit having a cross-coupled structure for sensing data of a data bus line according to a sense amp control signal. A precharge unit provides a precharge voltage to the amplifying unit according to a sense amp enable signal. A switching means maintains a disabled state of the sense amp enable signal by connecting a plurality of switching elements in series to an input terminal of the sense amp enable signal.

According to another aspect of the inventions, a data bus sense amplifier circuit includes an amplifying unit, a precharge unit and a switching means. An amplifying unit having a cross-coupled structure for sensing data of a data bus line according to a sense amp control signal. A precharge unit provides a precharge voltage to the amplifying unit according to a sense amp enable signal. A switching means is turned on for grounding a sensing voltage of the amplifying unit when the sense amp enable signal is enabled and for maintaining a disabled state of the sense amp enable signal, operating as a resistance element, when the sense amp enable signal is disabled.

BRIEF DESCRIPTION OF THE DRAWINGS

The present invention will become better understood with reference to specific embodiments shown in the drawings and described in the specification. These embodiments are exemplary and are not intended to be the sole arrangements that can be made in accordance with the principles of the inventions described and/or claimed in this patent document.

DETAILED DESCRIPTION

Figure 1:
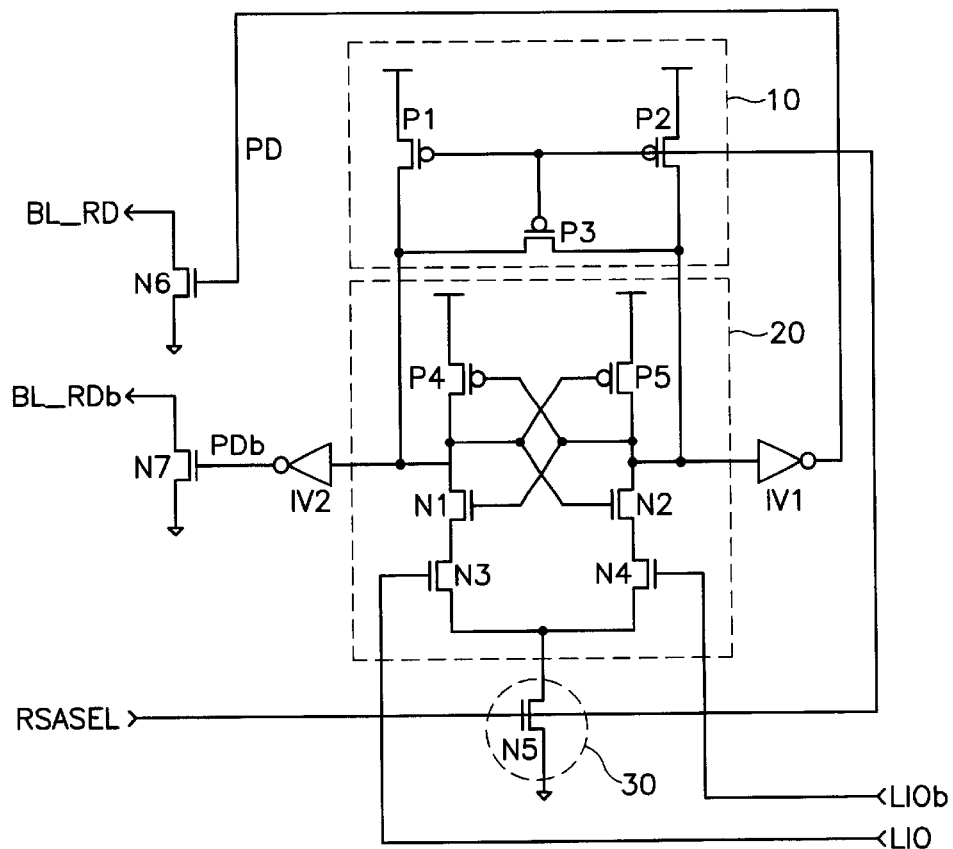
FIG. 1 (Prior Art) is a circuit diagram illustrating a conventional data bus sense amplifier circuit.
Figure 2:
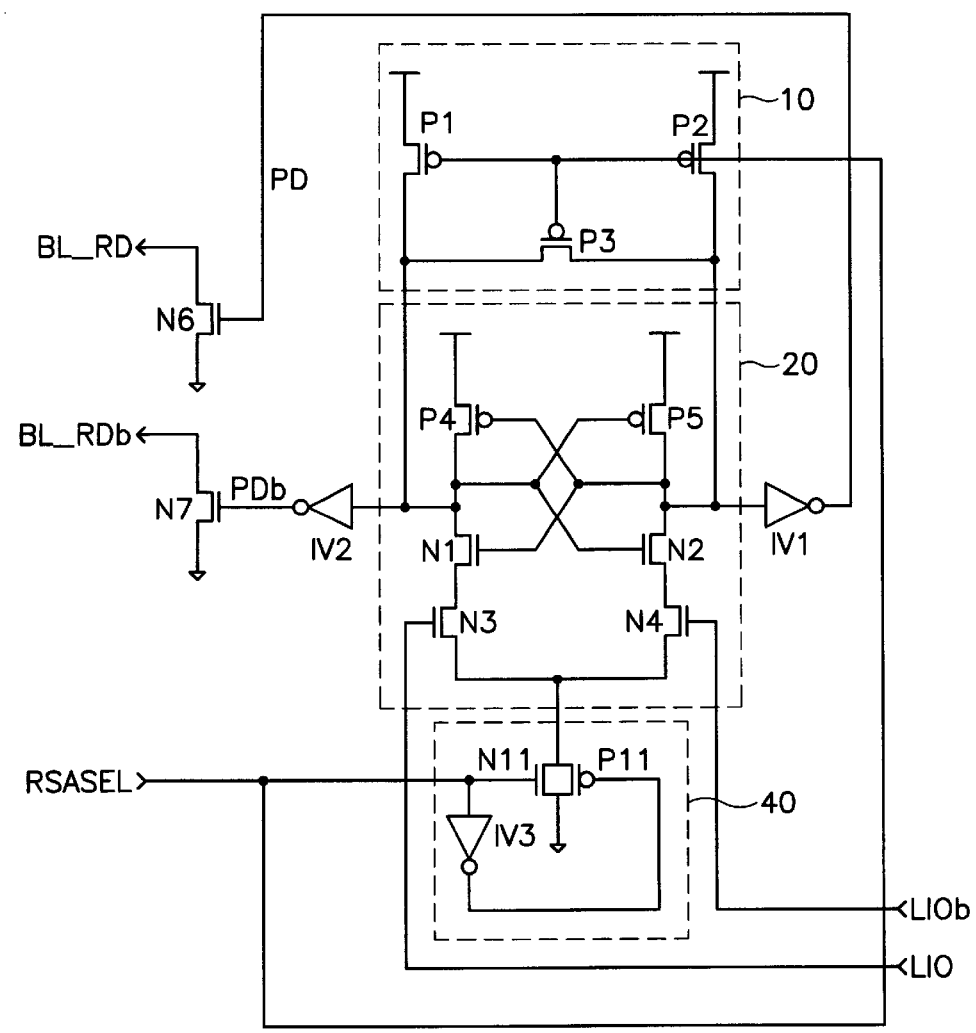
FIG. 2 is a circuit diagram illustrating a data bus sense amplifier circuit in accordance with a first embodiment of the inventions presented in this document.
Figure 3:
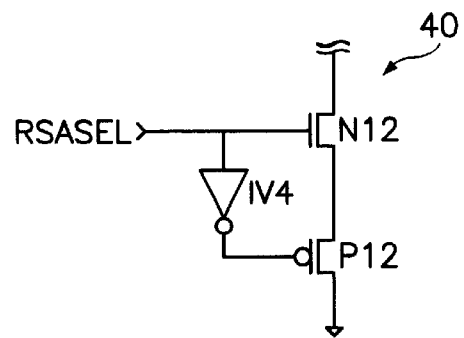
FIG. 3 is a circuit diagram illustrating a data bus sense amplifier circuit in accordance with a second embodiment of the present invention.
Figure 4:
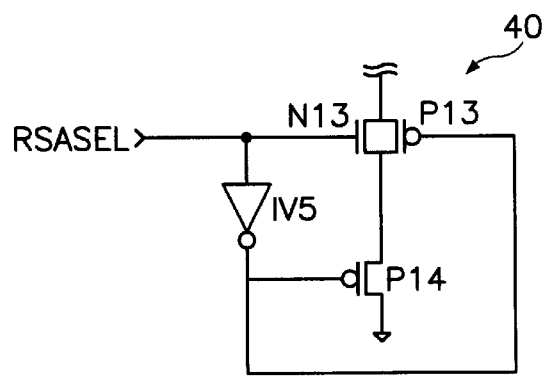
FIG. 4 is a circuit diagram illustrating a data bus sense amplifier circuit in accordance with a third embodiment of the present invention.

Referring to FIGS. 2, 3 and 4, exemplary embodiments of the principles of the inventions will be described in detail.

FIG. 2 is a circuit diagram illustrating a data bus sense amplifier circuit in accordance with a first embodiment of the inventions presented in this document. A precharge unit 10 includes PMOS transistors P1 and P2 having their gate terminals in common connected to receive a sense amp enable signal RSASEL, and precharging a power supply voltage. A PMOS transistor P3 equalizes output terminals of the precharge unit 10. Here, the PMOS transistors P1 and P2 receive the power supply voltage through their source terminals, and the PMOS transistor P3 is connected between drain terminals of the PMOS transistors P1 and P2.

An amplifying unit 20 includes NMOS transistors N1 and N2 and PMOS transistors P4 and P5 connected in a cross-coupled structure. NMOS transistors N3 and N4 receive data signals through their respective gate terminals from data bus lines LIO and LIOb.

A switching unit 40 includes a transmission gate connected to a common source terminal of the NMOS transistors N3 and N4 of the amplifying unit 20. The transmission gate includes an NMOS transistor N11 connected to the common source terminal of the NMOS transistors N3 and N4 and a PMOS transistor P11 receiving the sense amp enable signal RSASEL inverted by an inverter IV3.

The operation of the data bus sense amplifier circuit in accordance with the present inventions will now be explained.

First, outputs of the amplifying unit 20 become high during a precharge period, and thus output signals PD and PDb maintain a low state by inverters IV1 and IV2. At this time, bit line read signals BL_RD and BL_RDb are in a high state, and the sense amp enable signal RSASEL maintains a low state.

Because the sense amp enable signal RSASEL is in a low state, the PMOS transistors P1, P2 and P3 are turned on, and thus potentials of both ends of the cross-coupled latch of the amplifying unit 20 maintain a high state.

On the other hand, when a data bus sense amp is in read operation, a pulse of the sense amp enable signal RSASEL maintains a logic high state for 3 to 4 ns, and the PMOS transistors P1, P2 and P3 are turned off during that period. Here, the data inputted from the data bus lines LIO and LIOb is sensed in the amplifying unit 20 according to a degree of turn-on states of the NMOS transistors N3 and N4 respectively. That is, in the data bus lines LIO and LIOb precharged to a high level in the read operation, the data bus line LIO is in a logic high state, and the data bus line bar LIOb is in a logic low state. The two potentials respectively turn on the NMOS transistor N3 of the amplifying unit 20, and turn off the NMOS transistor N4 thereof.

When the sense amp enable signal RSASEL is enabled in a high level, the transmission gates N11 and P11 are turned on by receiving the sense amp enable signal RSASEL and the sense amp enable signal RSASEL inverted by the inverter IV3, and the PMOS transistors P1~P3 are turned off.

When the PMOS transistors P1~P3 are turned on due to the power supply voltage, the PMOS transistor P4, the NMOS transistors N1 and N3, and the transmission gates N11 and P11 are turned on, accordingly grounding the power supply voltage. And then, a low level signal is outputted to the inverter IV2. In addition, since the output signal PDb from the amplifying unit 20 is in a high state, the NMOS transistor N7 is turned off, and thus the bit line read bar signal BL_RDb is in a low state.

At this time, when the transmission gates N11 and P11 are turned on, a sensing current can be rapidly grounded to a ground terminal while the pulse of the sense amp enable signal RSASEL is enabled in a high level.

When the NMOS transistor N4 is turned on, a high level signal is outputted to the inverter IV1. An NMOS transistor N6 is turned on by receiving the output signal PD from the amplifying unit 20, and outputs a high level signal.

FIG. 3 is a circuit diagram illustrating a switching unit in accordance with a second embodiment of the present invention. The switching unit 40 includes an NMOS transistor N12 for receiving the sense amp enable signal RSASEL via its gate terminal. A PMOS transistor P12 is connected in series between the NMOS transistor N12 and the ground terminal for receiving the sense amp enable signal RSASEL inverted by an inverter IV4 via its gate terminal. Here, the sense amp enable signal RSASEL must maintain a low state during the precharge period of the data bus sense amp.

When toggling occurs in the input terminal of the sense amp enable signal RSASEL due to noise of the sense amp enable signal RSASEL during the precharge period, the NMOS transistor N12 and the PMOS transistor P12 are simultaneously turned on and operates as resistance elements, thereby reducing a leakage current of the NMOS transistors N3 and N4 of the amplifying unit 20.

FIG. 4 is a circuit diagram illustrating a switching unit in accordance with a third embodiment of the present invention. The switching unit 40 includes an NMOS transistor N13 and a PMOS transistor P13. The transmission gates N13 and P13 respectively receive the sense amp enable signal RSASEL and the sense amp enable signal RSASEL inverted by an inverter IV5. In addition, the switching unit 40 further includes a PMOS transistor P14 connected in series between the transmission gates N13 and P13 and the ground terminal for receiving the sense amp enable signal RSASEL inverted by the inverter IV5 via gate terminal.

While the pulse of the sense amp enable signal RSASEL is in active high state in the read operation, the transmission gates and the PMOS transistor are turned on to rapidly ground a sensing current, thereby improving a sensing speed.

Moreover, when the sense amp enable signal is disabled during the precharge period, the PMOS transistor P14 is operated as a resistance element to prevent the flow of the leakage current.

As a result, when the sense amp enable signal is enabled, the switching unit is rapidly turned on to improve the sensing speed of the data bus sense amp. When the sense amp enable signal is disabled, the flow of the leakage current in the switching unit is prevented to increase a read margin of the data bus sense amp.

The inventions described herein may be embodied in various forms without departing from the spirit or essential characteristics thereof. Therefore, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A data bus sense amplifier circuit comprising:
    an amplifying unit having a cross-coupled structure for sensing data of a data bus line according to a sense amp control signal;

a precharge unit for providing a precharge voltage to the amplifying unit according to a sense amp enable signal; and a switching means for maintaining a turned off state when the sense amp enable signal is disabled and for preventing a flow of the leakage current in the amplifying unit, wherein the switching means includes a NMOS transistor and a PMOS transistor connected in series between the amplifying unit and a ground voltage terminal and having a gate to respectively receive the sense amp enable signal and an inverted sense amp enable signal.

2. The circuit according to claim 1, further comprising:

an inverter for inverting the sense amp enable signal and outputting the inverted sense amp enable signal to the PMOS transistor.

3. A data bus sense amplifier circuit comprising:

an amplifying unit having a cross-coupled structure for sensing data of a data bus line according to a sense amp control signal;

a precharge unit for providing a precharge voltage to the amplifying unit according to a sense amp enable signal; and a switching means turned on for grounding a sensing voltage of the amplifying unit when the sense amp enable signal is enabled, and operated as a resistance element for preventing a flow of the leakage current in the amplifying unit when the sense amp enable signal is disabled;

wherein the switching means includes a transmission gate and a PMOS transistor connected in series between the amplifying unit and a ground voltage terminal and having a gate to respectively receive the sense amp enable signal and an inverted sense amp enable signal.

4. The circuit according to claim 3, further comprising:

an inverter for inverting the sense amp enable signal and respectively outputting the inverted sense amp enable signal to the transmission gate and the PMOS transistor.

* * * * *